US009699685B1

(12) United States Patent
Zhou et al.

(10) Patent No.: US 9,699,685 B1
(45) Date of Patent: Jul. 4, 2017

(54) BATTERY LIFE ASSISTED SCHEDULING

(71) Applicant: QUALCOMM Incorporated, San Diego, CA (US)

(72) Inventors: Yan Zhou, San Diego, CA (US); Simone Merlin, San Diego, CA (US); Gwendolyn Denise Barriac, Encinitas, CA (US); George Cherian, San Diego, CA (US); Gang Ding, San Diego, CA (US); Alfred Asterjadhi, San Diego, CA (US); Qingjiang Tian, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/069,861

(22) Filed: Mar. 14, 2016

(51) Int. Cl.
H04W 52/02 (2009.01)
H04W 28/02 (2009.01)
G01R 31/36 (2006.01)

(52) U.S. Cl.
CPC .... *H04W 28/0221* (2013.01); *G01R 31/3689* (2013.01); *H04W 52/02* (2013.01)

(58) Field of Classification Search
CPC ........... H04W 76/048; H04W 52/0216; H04W 52/02; H04W 52/0212; H04W 52/0251; H04W 52/0261; H04W 52/04; H04W 52/30
USPC .......................................... 455/343.1–343.5
See application file for complete search history.

(56) References Cited

U.S. PATENT DOCUMENTS

| 6,072,784 | A * | 6/2000 | Agrawal ............... H04W 52/28 370/311 |
| 8,880,128 | B1 * | 11/2014 | Gopalakrishnan H04W 52/0261 455/343.5 |
| 9,225,759 | B2 * | 12/2015 | Vannithamby ........ H04L 5/0035 |
| 2012/0113971 | A1 | 5/2012 | Giaretta et al. |
| 2013/0258919 | A1 | 10/2013 | Damnjanovic |
| 2015/0189584 | A1 | 7/2015 | Holostov et al. |

OTHER PUBLICATIONS

Chen S., et al., "Life-Add: Lifetime Adjustable Design for WiFi Networks with Heterogeneous Energy Supplies," CoRR—Computing Research Repository, 2013, 8 pages.
Ta T., et al., "Improving Smartphone Battery Life Utilizing Device-to-device Cooperative Relays Underlaying LTE Networks," Jan. 22, 2014, 6 pages.

* cited by examiner

*Primary Examiner* — Philip Sobutka
(74) *Attorney, Agent, or Firm* — Loza & Loza

(57) ABSTRACT

In certain aspects, an apparatus for wireless communication comprises an interface configured to receive reports from wireless nodes, wherein each of the reports includes an indication of a battery life of a respective one of the wireless nodes. The apparatus also comprises a processing system configured to determine a schedule for communication based on the reported battery lives of the wireless nodes. The interface is further configured to output data for transmission to the wireless nodes based on the schedule or to output signals for transmission to the wireless nodes based on the schedule, each of the signals instructing a respective one of the wireless nodes to transmit data to the apparatus.

29 Claims, 7 Drawing Sheets

BATTERY LIFE ASSISTED SCHEDULING

FIELD

Certain aspects of the present disclosure generally relate to wireless communications and, more particularly, to battery life assisted scheduling in wireless communication systems.

BACKGROUND

A wireless communication system may include an access point ("AP") and one or more access terminals ("AT") that transmit data to and receive data from the AP. The AP may be coupled to a backbone network, which couples the AP to other networks (e.g., the Internet, PSTN, etc.). The ATs may include battery-powered wireless devices (e.g., phones, laptop computers, tablets, etc.). When the battery life of an AT is low, the transceiver of the AT may be in danger of going dead before the AT is able to receive or transmit data. However, currently, an AP does not consider the battery life of an AT when scheduling communication for the AT.

SUMMARY

One aspect relates to an apparatus for wireless communication. The apparatus comprises an interface configured to receive reports from wireless nodes, wherein each of the reports includes an indication of a battery life of a respective one of the wireless nodes. The apparatus also comprises a processing system configured to determine a schedule for communication based on the indications of the battery lives of the wireless nodes. The interface is further configured to output data for transmission to the wireless nodes based on the schedule or to output signals for transmission to the wireless nodes based on the schedule, each of the signals instructing a respective one of the wireless nodes to transmit data to the apparatus.

A second aspect relates to a method for wireless communication. The method comprises receiving reports from wireless nodes, wherein each of the reports includes an indication of a battery life of a respective one of the wireless node, and determining a schedule for communication based on the indications of the battery lives of the wireless nodes. The method further comprises outputting data for transmission to the wireless nodes based on the schedule or outputting signals for transmission to the wireless nodes based on the schedule, each of the signals instructing a respective one of the wireless nodes to transmit data.

A third aspect relates to an apparatus for wireless communication. The apparatus comprises means for receiving reports from wireless nodes, wherein each of the reports includes an indication of a battery life of a respective one of the wireless nodes, and means for determining a schedule based on the indications of the battery lives of the wireless nodes. The apparatus also comprises means for outputting data for transmission to the wireless nodes based on the schedule or outputting signals for transmission to the wireless nodes based on the schedule, each of the signals instructing a respective one of the wireless nodes to transmit data to the apparatus.

A fourth aspects relates to a computer readable medium. The computer readable medium comprises instructions stored thereon for receiving reports from wireless nodes, wherein each of the reports includes an indication of a battery life of a respective one of the wireless nodes, and determining a schedule for communication based on the indications of the battery lives of the wireless nodes. The computer readable medium also comprises instructions for outputting data for transmission to the wireless nodes based on the schedule or outputting signals for transmission to the wireless nodes based on the schedule, each of the signals instructing a respective one of the wireless nodes to transmit data.

A fifth aspect relates to a wireless node. The wireless node comprises at least one receiver configured to receive reports from wireless nodes, wherein each of the reports includes an indication of a battery life of a respective one of the wireless nodes, and a processing system configured to determine a schedule for communication based on the indications of the battery lives of the wireless nodes. The wireless node also comprises at least one transmitter configured to output data for transmission to the wireless nodes based on the schedule or to output signals for transmission to the wireless nodes based on the schedule, each of the signals instructing a respective one of the wireless nodes to transmit data.

A sixth aspect relates to an apparatus for wireless communication. The apparatus comprises a processing system configured to generate a report including an indication of a battery life of the apparatus. The apparatus also comprises an interface configured to output the report for transmission to a wireless node, and, after transmission of the report, receive data from the wireless node or a signal from the wireless node, the signal instructing the apparatus to transmit data to the wireless node.

A seventh aspect relates to a method for wireless communication. The method comprises generating a report including an indication of a battery life of an apparatus, and outputting the report for transmission to a wireless node. The method also comprises, after transmission of the report, receiving data from the wireless node or a signal from the wireless node, the signal instructing the apparatus to transmit data to the wireless node.

An eighth aspect relates to an apparatus for wireless communication. The apparatus comprises means for generating a report including an indication of a battery life of the apparatus, and means for outputting the report for transmission to a wireless node. The apparatus also comprises means for, after transmission of the report, receiving data from the wireless node or a signal from the wireless node, the signal instructing the apparatus to transmit data to the wireless node.

A ninth aspect relates to a computer readable medium. The computer readable medium comprises instructions stored thereon for generating a report including an indication of a battery life of an apparatus, and outputting the report for transmission to a wireless node. The computer readable medium also comprises instructions for, after transmission of the report, receiving data from the wireless node or a signal from the wireless node, the signal instructing the apparatus to transmit data to the wireless node.

A tenth aspect relates to a wireless node. The wireless nodes comprise a processing system configured to generate a report including an indication of a battery life of the wireless node. The wireless node also comprises at least one transmitter configured to transmit the report to another wireless node, and at least one receiver configured to receive, after transmission of the report, data from the other wireless node or a signal from the other wireless node, the signal instructing the wireless node to transmit data to the other wireless node.

DETAILED DESCRIPTION

Figure 1:
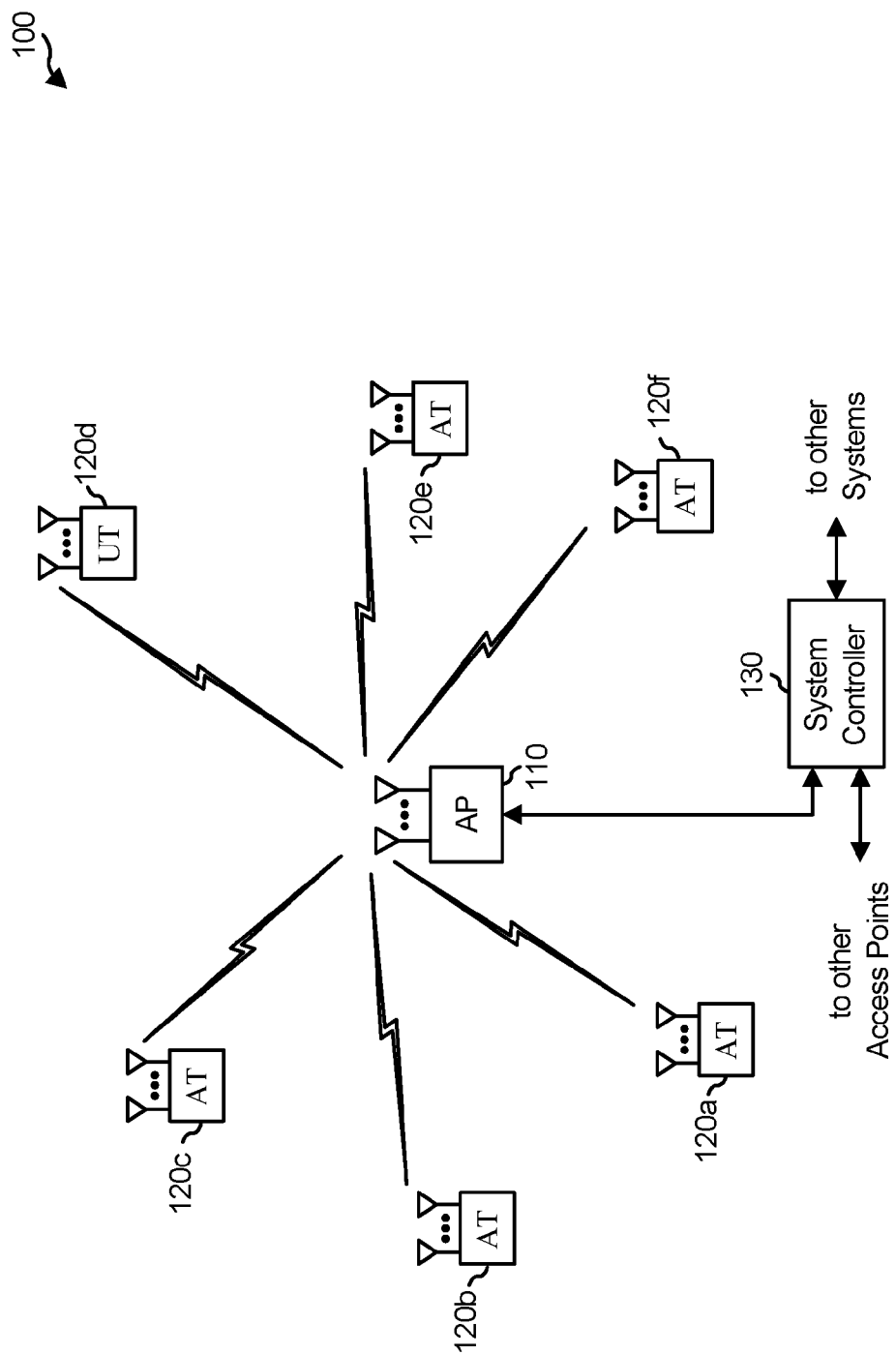
FIG. 1 illustrates an exemplary wireless communication system in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

An Example Wireless Communication System

The techniques described herein may be used for various broadband wireless communication systems, including communication systems that are based on an orthogonal multiplexing scheme. Examples of such communication systems include Spatial Division Multiple Access (SDMA), Time Division Multiple Access (TDMA), Orthogonal Frequency Division Multiple Access (OFDMA) systems, Single-Carrier Frequency Division Multiple Access (SC-FDMA) systems, and so forth. An SDMA system may utilize sufficiently different directions to simultaneously transmit data belonging to multiple access terminals. A TDMA system may allow multiple access terminals to share the same frequency channel by dividing the transmission signal into different time slots, each time slot being assigned to different access terminal. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The teachings herein may be incorporated into (e.g., implemented within or performed by) a variety of wired or wireless apparatuses (e.g., nodes). In some aspects, a wireless node implemented in accordance with the teachings herein may comprise an access point or an access terminal.

An access point ("AP") may comprise, be implemented as, or known as a wireless access point ("WAP"), a Radio Network Controller ("RNC"), a Base Transceiver Station ("BTS"), a Base Station ("BS"), a Transceiver Function ("TF"), a Radio Router, a Radio Transceiver, a Basic Service Set ("BSS"), an Extended Service Set ("ESS"), a Radio Base Station ("RBS"), or some other terminology.

An access terminal ("AT") may comprise, be implemented as, or known a station ("STA"), a subscriber station, a subscriber unit, a mobile station, a remote station, a remote terminal, a user terminal, a user agent, a user device, user equipment ("UE"), a user station, or some other terminology. In some implementations, an access terminal may comprise a cellular telephone, a cordless telephone, a Session Initiation Protocol ("SIP") phone, a wireless local loop ("WLL") station, a personal digital assistant ("PDA"), a handheld device having wireless connection capability, or some other suitable processing device connected to a wireless modem. Accordingly, one or more aspects taught herein may be incorporated into a phone (e.g., a cellular phone or smart phone), a computer (e.g., a laptop), a portable communication device, a portable computing device (e.g., a personal data assistant), an entertainment device (e.g., a music or video device, or a satellite radio), a global positioning system device, or any other suitable device that is configured to communicate via a wireless or wired medium. In some aspects, the node is a wireless node. Such wireless node may provide, for example, connectivity for or to a network (e.g., a wide area network such as the Internet or a cellular network) via a wired or wireless communication link.

With reference to the following description, it shall be understood that not only communications between access points and access terminals are allowed, but also direct (e.g., peer-to-peer) communications between respective access terminals are allowed. Furthermore, a device (e.g., an access point or access terminal) may change its behavior between an access terminal and an access point according to various conditions.

FIG. 1 is a diagram of an exemplary wireless communication system 100 in accordance with certain aspects of the present disclosure. The wireless communication system 100 includes a plurality of wireless nodes, such as access points and access terminals. For simplicity, only one access point 110 is shown. The access point 110 may communicate (e.g., according to an IEEE 802.11 protocol) with one or more access terminals ("ATs") 120a-120f at any given moment on the downlink and uplink. The downlink (i.e., forward link) is the communication link from the access point 110 to the access terminals 120a-120f, and the uplink (i.e., reverse link) is the communication link from the access terminals 120a-120f to the access point 110. An access terminal may also communicate peer-to-peer with another access terminal. A system controller 130 couples to and provides coordination and control for the access points. The access point 110 may communicate with other devices coupled to a backbone network. The wireless communication system 100 is discussed further below.

Figure 2:
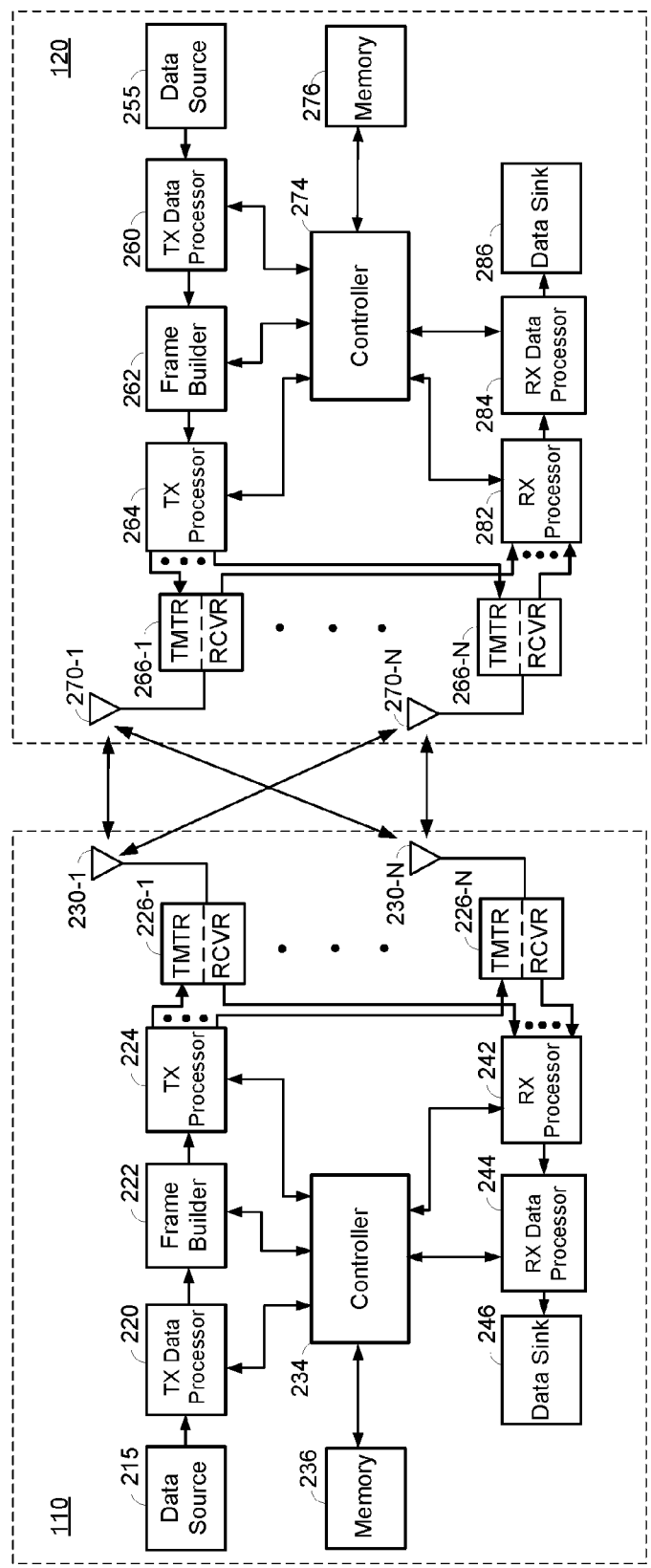
FIG. 2 is a block diagram of an exemplary access point and access terminal in accordance with certain aspects of the present disclosure.

FIG. 2 illustrates a block diagram of an access point 110 (generally, a first wireless node) and an access terminal 120 (generally, a second wireless node) of the wireless communication system 100. The access point 110 is a transmitting entity for the downlink and a receiving entity for the uplink. The access terminal 120 is a transmitting entity for the uplink and a receiving entity for the downlink. As used herein, a "transmitting entity" is an independently operated apparatus or wireless node capable of transmitting data via a wireless channel, and a "receiving entity" is an independently operated apparatus or wireless node capable of receiving data via a wireless channel.

For transmitting data, the access point 110 comprises a transmit data processor 220, a frame builder 222, a transmit processor 224, a plurality of transceivers 226-1 to 226-N, and a plurality of antennas 230-1 to 230-N. The access point 110 also comprises a controller 234 configured to control operations of the access point 110, as discussed further below.

In operation, the transmit data processor 220 receives data (e.g., data bits) from a data source 215, and processes the data for transmission. For example, the transmit data processor 220 may encode the data (e.g., data bits) into encoded data, and modulate the encoded data into data symbols. The transmit data processor 220 may support different modulation and coding schemes (MCSs). For example, the transmit data processor 220 may encode the data at any one of a plurality of different coding rates. Also, the transmit data processor 220 may modulate the encoded data using any one of a plurality of different modulation schemes, including, but not limited to, BPSK, QPSK, 16QAM, 64QAM, 64APSK, 128APSK, 256QAM, and 256APSK.

In certain aspects, the controller 234 may send a command to the transmit data processor 220 specifying which modulation and coding scheme (MCS) to use (e.g., based on channel conditions of the downlink), and the transmit data processor 220 may encode and modulate data from the data source 215 according to the specified MCS. It is to be appreciated that the transmit data processor 220 may perform additional processing on the data such as data scrambling, and/or other processing. The transmit data processor 220 outputs the data symbols to the frame builder 222.

The frame builder 222 constructs a frame (also referred to as a packet), and inserts the data symbols into a data payload of the frame. Exemplary frame structures or formats are discussed further below. The frame builder 222 outputs the frame to the transmit processor 224. The transmit processor 224 processes the frame for transmission on the downlink. For example, the transmit processor 224 may support different transmission modes such as an orthogonal frequency-division multiplexing (OFDM) transmission mode and a single-carrier (SC) transmission mode. In this example, the controller 234 may send a command to the transmit processor 224 specifying which transmission mode to use, and the transmit processor 224 may process the frame for transmission according to the specified transmission mode.

In certain aspects, the transmit processor 224 may support multiple-output-multiple-input (MIMO) transmission. In these aspects, the access point 210 includes multiple antennas 230-1 to 230-N and multiple transceivers 226-1 to 226-N (e.g., one for each antenna). The transmit processor 224 may perform spatial processing on the incoming frames and provide a plurality of transmit streams for the plurality of antennas. The transceivers 226-1 to 226-N receive and process (e.g., convert to analog, amplify, filter, and frequency upconvert) the respective transmit streams to generate transmit ready signals for transmission via the antennas 230-1 to 230-N.

For transmitting data, the access terminal 120 comprises a transmit data processor 260, a frame builder 262, a transmit processor 264, a plurality of transceivers 266-1 to 266-N, and a plurality of antennas 270-1 to 270-N. The access terminal 120 may transmit data to the access point 110 on the uplink, and/or transmit data to another access terminal (e.g., for peer-to-peer communication). The access terminal 120 also comprises a controller 274 configured to control operations of the access terminal 220, as discussed further below.

In operation, the transmit data processor 260 receives data (e.g., data bits) from a data source 255, and processes (e.g., encodes and modulates) the data for transmission. The transmit data processor 260 may support different MCSs. For example, the transmit data processor 260 may encode the data at any one of a plurality of different coding rates, and modulate the encoded data using any one of a plurality of different modulation schemes, including, but not limited to, BPSK, QPSK, 16QAM, 64QAM, 64APSK, 128APSK, 256QAM, and 256APSK. In certain aspects, the controller 274 may send a command to the transmit data processor 260 specifying which MCS to use (e.g., based on channel conditions of the uplink), and the transmit data processor 260 may encode and modulate data from the data source 255 according to the specified MCS. It is to be appreciated that the transmit data processor 260 may perform additional processing on the data. The transmit data processor 260 outputs the data symbols to the frame builder 262.

The frame builder 262 constructs a frame, and inserts the received data symbols into a data payload of the frame. Exemplary frame structures or formats are discussed further below. The frame builder 262 outputs the frame to the transmit processor 264. The transmit processor 264 processes the frame for transmission. For example, the transmit processor 264 may support different transmission modes such as an OFDM transmission mode and an SC transmission mode. In this example, the controller 274 may send a command to the transmit processor 264 specifying which transmission mode to use, and the transmit processor 264 may process the frame for transmission according to the specified transmission mode.

In certain aspects, the transmit processor 264 may support multiple-output-multiple-input (MIMO) transmission. In these aspects, the access terminal 220 includes multiple antennas 270-1 to 270-N and multiple transceivers 266-1 to 266-N (e.g., one for each antenna). The transmit processor 264 may perform spatial processing on the incoming frame and provide a plurality of transmit streams for the plurality of antennas. The transceivers 266-1 to 266-N receive and process (e.g., convert to analog, amplify, filter, and frequency upconvert) the respective transmit streams to generate transmit ready signals for transmission via the antennas 270-1 to 270-N.

For receiving data, the access point 110 comprises a receive processor 242, and a receive data processor 244. In operation, the transceivers 226-1 to 226-N receive signals (e.g., from the access terminal 120) via the antennas 230-1 to 230-N, and process (e.g., frequency downconvert, amplify, filter and convert to digital) the received signals.

The receive processor 242 receives the outputs of the transceivers 226-1 to 226-N, and processes the outputs to recover data symbols. For example, the access point 210 may receive data (e.g., from the access terminal 120) in a frame. In this example, the receive processor 242 may detect the start of the frame using a short training field ("STF") sequence in the preamble of the frame. The receive processor 242 may also perform channel estimation (e.g., using the channel estimation sequence in the preamble of the frame) and perform channel equalization on the received signal based on the channel estimation.

The receive processor 242 may also recover information (e.g., MCS scheme) from the header of the frame, and send the information to the controller 234. After performing channel equalization, the receive processor 242 may recover data symbols from the frame, and output the recovered data symbols to the receive data processor 244 for further processing. It is to be appreciated that the receive processor 242 may perform other processing.

The receive data processor 244 receives the data symbols from the receive processor 242 and an indication of the corresponding MSC scheme from the controller 234. The receive data processor 244 demodulates and decodes the data symbols to recover the data according to the indicated MSC scheme, and outputs the recovered data (e.g., data bits) to a data sink 246 for storage and/or further processing.

As discussed above, the access terminal 120 may transmit data using an OFDM transmission mode or a SC transmission mode. In this case, the receive processor 242 may process the receive signal according to the selected transmission mode. Also, as discussed above, the transmit processor 264 may support multiple-output-multiple-input (MIMO) transmission. In this case, the access point 210 includes multiple antennas 230-1 to 230-N and multiple transceivers 226-1 to 226-N (e.g., one for each antenna). Each transceiver receives and processes (e.g., frequency downconverts, amplifies, filters, frequency upconverts) the signal from the respective antenna. The receive processor 242 may perform spatial processing on the outputs of the transceivers 226-1 to 226-N to recover the data symbols.

For receiving data, the access terminal 120 comprises a receive processor 282, and a receive data processor 284. In operation, the transceivers 266-1 to 266-N receive signals (e.g., from the access point 210 or another access terminal) via the antennas 270-1 to 270-N, and process (e.g., frequency downconvert, amplify, filter and convert to digital) the received signals.

The receive processor 282 receives the output of the transceivers 266-1 to 266-N, and processes the output to recover data symbols. For example, the access terminal 120 may receive data (e.g., from the access point 110 or another access terminal) in a frame, as discussed above. In this example, the receive processor 282 may detect the start of the frame using the STF sequence in the preamble of the frame. The receive processor 282 may also perform channel estimation (e.g., using the channel estimation sequence in the preamble of the frame) and perform channel equalization on the received signal based on the channel estimation.

The receive processor 282 may also recover information (e.g., MCS scheme) from the header of the frame, and send the information to the controller 274. After performing channel equalization, the receive processor 282 may recover data symbols from the frame, and output the recovered data symbols to the receive data processor 284 for further processing. It is to be appreciated that the receive processor 282 may perform other processing.

The receive data processor 284 receives the data symbols from the receive processor 282 and an indication of the corresponding MSC scheme from the controller 274. The receiver data processor 284 demodulates and decodes the data symbols to recover the data according to the indicated MSC scheme, and outputs the recovered data (e.g., data bits) to a data sink 286 for storage and/or further processing.

As discussed above, the access terminal 120 or another access terminal may transmit data using an OFDM transmission mode or a SC transmission mode. In this case, the receive processor 282 may process the receive signal according to the selected transmission mode. Also, as discussed above, the transmit processor 224 may support multiple-output-multiple-input (MIMO) transmission. In this case, the access terminal 220 includes multiple antennas 270-1 to 270-N and multiple transceivers 266-1 to 266-N (e.g., one for each antenna). Each transceiver receives and processes (e.g., frequency downconverts, amplifies, filters, frequency upconverts) the signal from the respective antenna. The receive processor 282 may perform spatial processing on the outputs of the transceivers to recover the data symbols.

As shown in FIG. 2, the access point 110 also comprises a memory 236 coupled to the controller 234. The memory 236 may store instructions that, when executed by the controller 234, cause the controller 234 to perform one or more of the operations described herein. Similarly, the access terminal 120 also comprises a memory 276 coupled to the controller 274. The memory 276 may store instructions that, when executed by the controller 274, cause the controller 274 to perform the one or more of the operations described herein.

Battery Assisted Scheduling

Referring back to FIG. 1, the AP 110 coordinates data traffic between the AP 110 and the ATs 120a-120f. For example, when an AT (e.g., AT 120a) has UL data to transmit, the AT may transmit a scheduling request to the AP 110. In response to the scheduling request, the AP 110 may schedule a time for the AT to transmit the UL data, and transmit a transmit ready signal to the AT at the scheduled time indicating that the AP 110 is ready to receive the UL data. In response to receiving the transmit ready signal, the AT may transmits the UL data to the AP 110. Alternatively, in response to the scheduling request, the AP 110 may transmit a UL schedule to the AT indicating when the AT is scheduled to transmit the UL data to the AP 110. The AT may then transmit the UL data to the AP 110 at the transmission time indicated in the UL schedule.

In another example, when the AP 110 has data to transmit to an AT (e.g., AT 120a), the AP 110 may transmit a beacon to the AT indicating that the AP 110 has DL data awaiting transmission to the AT. The AT may respond by transmitting a message (e.g., power save poll ("PS-Poll") frame) indicating that the AT is ready to receive the DL data. After receiving the messages (e.g., PS-Poll frame) from the AT 120, the AP 110 may transmit the DL data to the AT.

An AT (e.g., AT 120a) may comprise a mobile device powered by a battery. When the battery life of an AT is low, the transceiver of the AT may be in danger of going dead before the AT is able to receive or transmit data. However, currently, an AP does not consider the battery life of an AT when scheduling a DL transmission and/or a UL transmission for the AT. In other words, an AP does not differentiate between ATs with different battery lives, and hence does not prioritize scheduling for low battery life ATs.

Embodiments of the present disclosure address the above problem by having the ATs 120a-120f report their battery lives to the AP 110. For example, each of the ATs 120a-120f may report its battery life to the AP 110 in a message transmitted to the AP 110, as discussed further below. The AP 110 may optimize scheduling and/or transmission parameters for the ATs 120a-120f based on the reported battery lives of the ATs 120a-120f to reduce power consumption for the ATs having low battery life, as discussed further below.

Each of the ATs 120a-120f may wirelessly report its battery life to the AP 110 in one or more of the following formats: a percentage of remaining battery life, an absolute time of remaining battery life (e.g., X hours left), and an absolute remaining battery charge (e.g., mA*hour). The percentage of remaining battery life may be determined based on a ratio of the remaining charge of the battery and the charge storage capacity of the battery. The charge of the battery may be given in units of mA*hour or other units. The time of remaining battery life may be determined by calculating an average rate at which the battery is discharged over a period of time, and dividing the remaining charge of the battery by the average discharge rate. The discharge rate may be given in units of mA or other units. It is to be appreciated that aspects of the present disclosure are not limited to the exemplary formats given above, and that battery life may be reported using other formats.

Upon receiving a battery life report from an AT (e.g., AT 120a), the AP 110 may categorize the AT as having low battery life or not having low battery life based on the reported battery life of the AT. For example, the AP 110 may categorize an AT as having a low battery life if the reported battery life of the AT is equal to or below a battery life threshold. The battery life threshold may be a certain percentage of remaining battery life (e.g., 10%), a certain time of remaining battery life, or a certain remaining battery charge depending on the format of the reported battery life. The AP 110 may categorize the AT as not having low battery life if the battery life of the AT is above the battery life threshold.

In another example, an AT (e.g., AT 120a) may compare its battery life with a battery life threshold, and determine whether the AT has a low battery life based on the comparison. The battery life threshold may be a certain percentage of remaining battery life (e.g., 10%), a certain time of remaining battery life, or a certain remaining battery charge depending on the format of the battery life. The AT may determine that the AT has a low battery life if the battery life is equal to or below the battery life threshold, and determine the AT does not have a low battery life if the battery life is above the battery life threshold. In this example, the AT may transmit a report indicating whether the AT has a low battery life based on the determination. For example, the AT may transmit a bit to the AP 110, in which the value of the bit indicates whether the AT has a low battery life.

An AT (e.g., AT 120a) may also report a charging status of the battery of the AT to the AP 110. The charging status may indicate whether the battery is in the process of being charged (e.g., by a battery charger). In this example, the AP 110 may categorize an AT as not having a low battery life if the AT is being charged regardless of the actual battery life of the AT. If the AT is not being charged, then the AP 110 may determine whether the AT has a low battery life by, for example, comparing the battery life of the AT with a battery life threshold, as discussed above.

If the AT is being charged, the AT may also report the type of charging source being used to charge the battery of the AT. Examples of types of charging sources may include a portable charger, a wall charger, a car charger, etc. A portable charger may comprise an external battery that is used to charge the battery of the AT. In this example, the AP 110 may categorize an AT as not having a low battery life if the AT is being charged by certain types of charging sources regardless of the actual battery life of the AT. For instance, the AP 110 may categorize the AT as not having a low battery life if the AT is being charged by a wall charger regardless of the actual battery life of the AT. If the AT is being charged by a portable charger, then the AP 110 may determine whether the AT has a low battery life by, for example, comparing the battery life of the AT with a battery life threshold. This is because a portable charger may have a finite amount of charge that can be delivered to the battery of the AT. For instance, the portable charger may itself have a low battery life. Thus, in this example, the type of charger being used to charge the battery of the AT affects whether the AT is considered to have a low battery life for scheduling purposes.

In another example, an AT (e.g., AT 120a) may determine whether the AT has a low battery life, and transmit a report indicating whether the AT has a low battery life based on the determination. In this example, the AT may consider whether the AT is in the process of being charged (e.g., by a battery charger). If the AT is being charged, then the AT may determine that the AT does not have low battery life regardless of the actual battery life of the AT. If the AT is not being charged, then the AT may determine whether the AT has low battery life by, for example, comparing the battery life of the AT with a battery life threshold, as discussed above.

The AT may also consider the charging source in making a determination whether the AT has a low battery life. For instance, the AT may determine that the AT does not have a low battery life if the AT is being charged by a wall charger regardless of the actual battery life of the AT. If the AT is being charged by a portable charger, then the AT may determine whether the AT has a low battery life by, for example, comparing the battery life of the AT with a battery life threshold. Thus, in this example, the type of charger being used to charge the battery of the AT affects whether the AT is considered to have a low battery life for scheduling purposes. In this example, the AT may transmit a report indicating whether the AT has a low battery life based on the determination. For example, the AT may transmit a bit to the AP 110, in which the values of the bit indicates whether the AT has a low battery life.

Figure 3:
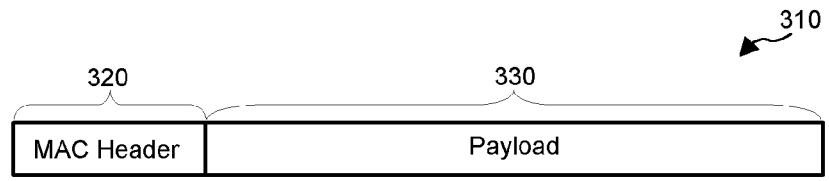
FIG. 3 illustrates an exemplary media access control ("MAC") frame in accordance with certain aspects of the present disclosure.

An AT (e.g., AT 120a) may report its battery life to the AP 110 using any one of a variety of methods. For example, the AT 120 may include a battery life report in a control field of a media access control ("MAC") frame transmitted to the AP 110. In this regard, FIG. 3 shows an example of a MAC frame 310 comprising a header 320 and a payload 330 (also referred to as a frame body). The MAC header 320 includes a control field (not shown), which may be a high throughput ("HT") control field, a high efficiency ("HE") control field, or other type of control field. The control field may be located in any one of a number of different locations in the header 320. The header 320 may also include address information (e.g., address of source and destination of the frame). In this example, the AT may include the battery life report in the control field (e.g., in a subfield of the control field) at the MAC layer. The battery life report may include an indication of the battery life of the AT and/or battery charging status of the AT, as discussed above.

Figure 4:
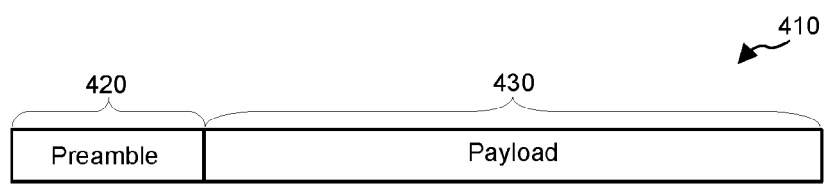
FIG. 4 illustrates an exemplary physical frame in accordance with certain aspects of the present disclosure.

In another example, the AT may include a battery life report in the preamble of a physical frame 410 transmitted to the AP 110. In this regard, FIG. 4 shows an example of a physical frame 410 comprising a physical layer preamble 420 and a payload 430. The payload 430 may include one or more MAC frames. The preamble 420 may include information to assist the AP 110 in receiving the frame 410, such as a short training field ("STF"), a channel estimation sequence, rate control information, etc. In this example, the AT 120 may include the battery life report in the preamble 420 (e.g., in a field in the preamble 420) at the physical ("PHY") layer. The battery life report may include an indication of the battery life of the AT and/or battery charging status of the AT, as discussed above.

In certain aspects, an AT (e.g., AT 120a) may include a battery life report in a message that is transmitted to the AP 110 in response to a request from the AP 110. For example, the AP 110 may transmit a request to the AT requesting a battery life report from the AT. In response to the request, the AT may transmit a message to the AP 110 including the battery life report. The battery life report may include an indication of the battery life of the AT and/or battery charging status of the AT, as discussed above.

In certain aspects, the AP 110 may transmit a message to an AT (e.g., AT 120a) including a reporting parameter that controls when the AT transmits a battery life report to the AP 110. For example, the reporting parameter may indicate a periodicity with which the AT is to transmit a battery life report to the AP 110 (e.g., the reporting parameter may indicate a time period (interval) between transmission of adjacent reports). In this example, the AT may transmit battery life reports on a periodic basis.

In another example, the reporting parameter may indicate a trigger event, in which the occurrence of the trigger event triggers the AT to transmit a battery life report to the AP 110. For example, the reporting parameter may indicate a reporting threshold. In this example, the AT may transmit a battery life report when the battery life of the AT falls below the reporting threshold. The reporting threshold may be a certain percentage of remaining battery life (e.g., 10%), a certain time of remaining battery life, or a certain remaining battery charge depending on the format of the battery life. The reporting threshold may be the same as or different from the battery life threshold used to categorize whether the AT has a low battery life discussed above. In this example, the AP 110 may assume that an AT does not have a low battery life if the AP 110 does not receive a battery life report from an AT within a certain time period. Thus, in this example, reporting of the battery life of the AT is triggered by the battery life falling below the reporting threshold.

In another example, the reporting parameter may indicate that the AT is to transmit a battery life report when the AT is being charged. In this example, the battery life report may include the battery charging status of the AT. Thus, in this example, reporting of the battery life of the AT is triggered by the AT being charged (e.g., the AT is plugged into a charger). In this example, the battery life report may cause the AP 110 to change the battery status of the AT from low battery life to non-low battery life. For instance, if the AP 110 considers the AT as having a low battery life before receiving the battery life report, then the AP 110 may change the status of the AT to non-low battery life in response to a battery life report indicating that the AT is being charged (e.g., by a wall charger). This may occur, for example, when the user plugs the AT into a charger, triggering the report. In one example, a report may be triggered when both the AT 120 is being charged and the actual battery life of the AT is below the reporting threshold.

Thus, the AP 110 may configure when the AT transmits a battery life report to the AP 110 by transmitting one or more reporting parameters to the AT (e.g., periodicity of reports, a trigger event for triggering a report, etc.). The AT may transmit a battery life report in a message, the control field (e.g., HT or HE control field) of a MAC frame, the preamble of a physical frame, etc.

In certain aspects, the AP 110 provides early scheduling for ATs determined to have low battery life. This reduces the transmit/receive wait times for these ATs, and hence reduces power consumption for these ATs, as discussed further below.

For example, the AP 110 may transmit DL data to multiple ATs (e.g., ATs 120a-120f or a subset of AT 120a-120f) in a power save ("PS") mode. In this example, each AT may alternative between a sleep mode and an awake mode, in which the AT may power down its transceiver (e.g., RF chain) in the sleep mode to conserve power and power up its transceiver in the awake mode to receive DL data. In this example, each AT may periodically wakeup from the sleep mode to receive DL data from the AP 110.

Figure 5:
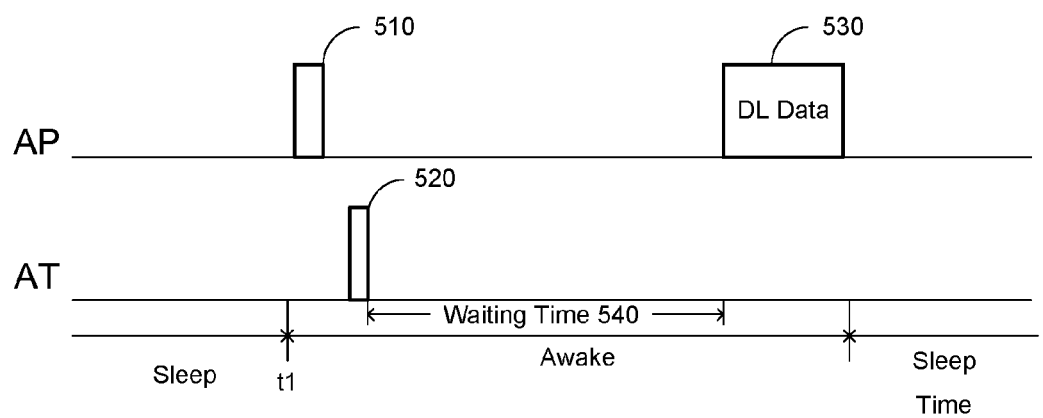
FIG. 5 is a timeline illustrating an exemplary procedure for transmitting data to an access terminal ("AT") in accordance with certain aspects of the present disclosure.

In this regard, FIG. 5 shows an exemplary timeline for DL transmission to an AT (e.g., AT 120a) in the PS mode. In this example, the AT wakes up from the sleep mode at time t1 to listen for a beacon from the AP 110 indicating whether the AP 110 has DL data awaiting transmission to the AT. If the AP 110 has DL data destined for the AT, then the AP 110 transmits a beacon 510 indicating that the AP 110 has DL data awaiting transmission to the AT. The DL data may be data for the AT that accumulated in a buffer or queue of the AP 110 while the AT was asleep. In response to the beacon 510, the AT may transmit a message 520 (e.g., PS-Poll frame) indicating that the AT is ready to receive the DL data. The message 520 may also include a battery life report indicating the battery life of the AT. In response to the message 520, the AP 110 transmits the DL data 530 after a waiting time 540. During the waiting time 540, the AT may keep its transceiver (e.g., RF chain) powered on to monitor for the DL data transmission. After receiving the DL data 530, the AT 120 may go back to sleep. In one example, the AP 110 may transmit multiple DL data frames to the AT. In this example, the AP 110 may transmit the DL data frames one at a time, in which the AT may transmit a message (e.g., PS-Poll frame) for each frame.

It is desirable to reduce the waiting time 540 for a low battery life AT. This is because the AT may keep its transceiver (e.g., RF chain) powered on during the waiting time 540, which may consume a substantial amount of energy. Reducing the waiting time 540 reduces the amount of energy the AT consumes monitoring for the DL data transmission, thereby allowing the AT to operate longer. In this regard, the AP 110 may prioritize DL transmissions for low battery life ATs over DL transmissions for non-low battery life ATs to reduce the waiting times for low battery life ATs, as discussed further below.

For example, when the AP 110 has DL data awaiting transmission to each one of multiple ATs (e.g., 120a-120c), the AP 110 may transmit a beacon to the ATs indicating that the AP 110 has DL data awaiting transmission to each of the ATs. Each AT may respond to the beacon by transmitting a message (e.g., PS-Poll frame) to the AP 110 indicating that the AT is ready to receive the respective DL data. Each message (e.g., PS-Poll frame) may also include a battery life report indicating the battery life of the respective AT.

Upon receiving the messages from the ATs, the AP 110 may determine a DL transmission schedule for transmitting the DL data to the ATs based on the battery lives of the ATs. For example, the AP 110 may transmit the DL data for a low battery life AT before transmitting the DL data for a non-low battery life AT. In this example, the AP 110 may determine whether an AT is a low battery life AT or a non-low battery life AT using any of the methods discussed above. Thus, in this example, the AP 110 prioritizes the DL data transmission for the low battery life AT over the DL data transmission for the non-low battery life AT. As a result, the low battery life AT receives its DL data earlier, thereby reducing the waiting time and energy consumption of the low battery life AT.

In another example, the AP 110 may transmit a beacon to a low battery life AT (e.g., AT 120a) indicating that the AP 110 has DL data awaiting transmission to the low battery life AT. The low battery life AT may respond to the beacon by transmitting a message (e.g., PS-Poll frame) to the AP 110 indicating that the AT is ready to receive the respective DL data.

At the time the AP 110 receives the message (e.g., PS-Poll frame) from the low battery life AT, a non-low battery life AT (e.g., AT 120b) may be waiting for DL data from the AP 110. In this case, the AP 110 may prioritize the DL transmission for the low battery life AT. In this regard, the AP 110 may transmit the DL data for the low battery life AT before transmitting the DL data for the non-low battery life AT 120. This reduces the waiting time for the low battery life AT.

In another example, at the time the AP 110 receives the message (e.g., PS-Poll frame) from the low battery life AT (e.g., AT 120a), the non-low battery life AT (e.g., AT 120b) may have already received a portion of its DL data (e.g., a portion of the DL frames destined for the non-low battery life AT). In this case, the AP 110 may prioritize the DL transmission for the low battery life AT. In this regard, the AP 110 may transmit the DL data for the low battery life AT before transmitting the remaining DL data for the non-low battery life AT. This reduces the waiting time for the low battery life AT.

If the AP 110 has DL data awaiting transmission for two or more low battery life ATs (e.g., ATs 120a-120c) and receives messages (e.g., PS-Poll frames) from the low battery life ATs, then the AP 110 may determine a DL transmission schedule for the low battery ATs based on their battery lives and/or other criterion. For example, the AP 110 may compare the battery lives of the low battery life ATs with one another, and schedule the DL data transmissions for the low battery life ATs in order of increasing battery life. In this example, the AP 110 may transmit the DL data for the low battery life AT with the lowest battery life (e.g., 4%), followed by the DL data for the low battery life with the second lowest battery life (e.g., 6%), and so forth. In this example, the DL transmissions for the low battery life ATs may be scheduled before non-low battery life ATs. Thus, DL transmissions for the low battery life ATs may be prioritized over DL transmissions for the non-low battery life ATs.

It is to be appreciated that aspects of the present disclosure are not limited to the above example, and that the AP 110 may determine a DL transmission schedule for low battery life ATs using other methods. For example, the AP 110 may schedule DL transmissions for low battery life ATs in a round robin fashion. In another example, the AP 110 may differentiate between a low battery life AT that is being charged by a portable charger and a low battery life AT that is not being charged. In this example, the AP 110 may prioritize DL transmission for the low battery life AT that is not being charged over the low battery life AT that is being charged by the portable charger, while prioritizing both over non-low battery life ATs.

In another example, the AP 110 may receive scheduling requests from multiple ATs (e.g., ATs 120a-120f or a subset of ATs 120a-120f), in which each request indicates that the respective AT has UL data to transmit to the AP 110. Each scheduling request may also include a battery life report for the respective AT. In response to the scheduling requests, the AP 110 may schedule a transmit time for at least one of the ATs to transmit its UL data. The AP 110 may then transmit a transmit ready signal to the at least one AT at the respective transmit time indicating to the at least one AT that the AP 110 is ready to receive the respective UL data from the AT. Each transmit ready signal may identify the respective at least one AT, which may transmit its UL data to the AP 110 in response to receiving the respective transmit ready signal.

In this example, after an AT (e.g., AT 120a) transmits a scheduling request to the AP 110, the AT may keep its transceiver (e.g., RF chain) powered to monitor for the respective transmit ready signal, which may consume a substantial amount of energy. Therefore, it may be desirable to reduce the amount of time a low battery life AT waits for the respective transmit ready signal to reduce energy consumption of the low battery life AT. In this regard, the AP 110 may prioritize UL transmissions for low battery life ATs over UL transmissions for non-low battery life ATs to reduce the waiting times for low battery life ATs 120, as discussed further below.

For example, if the AP 110 receives a scheduling request from a low battery life AT (e.g., AT 120a) and a scheduling request from a non-low battery life AT (e.g., AT 120b), then the AP 110 may transmit the transmit ready signal for the low battery life AT before the transmit ready signal for the non-low battery life AT. Thus, in this example, the low battery life AT transmits its UL data to the AP 110 earlier than the non-low battery life AT, thereby reducing energy consumption of the low battery life AT. In other words, the amount of time the low battery life AT needs to wait to transmit its UL data is reduced.

In certain aspects, the AP 110 selects more aggressive access parameters for ATs with low battery life to reduce their access delay, and hence reduce their energy consumption, as discussed further below.

Figure 6:
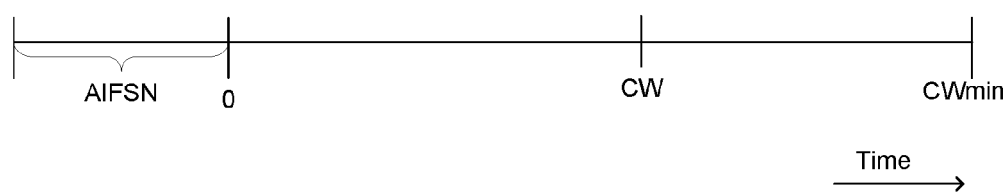
FIG. 6 is a timeline illustrating an exemplary procedure for accessing a resource in accordance with certain aspects of the present disclosure.

For example, access parameters at an AT (e.g., AT 120) may determine how long an AT waits to access a resource (e.g., frequency band) to transmit data. The access parameters may include an arbitration inter-frame space number ("AIFSN"), a minimum contention window ("CWmin"), and a maximum contention window ("CWmax"). In this example, when the AT needs to transmit a frame (e.g., to the AP 110), the AT may randomly select a contention window ("CW") within a contention window range of zero to CWmin, in which each of CW and CWmin corresponds to a number of time slots, an example of which is shown in FIG. 6. The AT may then wait for a time duration equal to AIFSN. After the AIFSN time, the AT monitors the resource (e.g., frequency band) for use by another device (e.g., another AT). In other words, the AT monitors the resource to determine if the resource is busy. The resource may also be referred to as the medium. If the AT does not detect use by another device within CW (i.e., does not detect that the resource is busy within CW), then the AT may transmit its frame using the resource.

If the AT does not successfully transmit its frame (e.g., does not receive an acknowledgement for the transmitted frame), then the AT may make a second attempt to transmits its frame. In the second attempt the AT may increase the contention window range. For example, the increased contention window range may be double the size of CWmin. The AT may then randomly select a CW within the increased contention window range. The AT may then wait for a time duration equal to AIFSN, after which time, the AT may monitor the resource (e.g., frequency band) to determine whether the resource is busy. If the AT does not detect that the resource is busy within CW, then the AT may determine the resource is free (idle) and transmit its frame using the resource. If the second transmission attempt is unsuccessful, then the AT may make another attempt to transmit the frame, and so forth. In each subsequent transmission attempt, the AT may increase the size of the contention window range up to CWmax. Thus, CWmax sets an upper limit on the contention window range.

As discussed above, the AP 110 may select more aggressive access parameters for a low battery life AT (e.g., AT 120a) compared with a non-low battery life AT (e.g., 120b) to reduce access delay for the low battery life AT. In this regard, the AP 110 may select a shorter AIFSN, a shorter CWmin and/or a shorter CWmin for the low battery life AT compared with a non-low battery life AT to reduce the access delay of the low battery life AT. The shorter AIFSN reduces the time that the low battery life waits before monitoring the resource (e.g., frequency band). The shorter CWmin and shorter CWmin reduce the contention window ranges, which increases the likelihood that the AT will find the resource free (idle), and transmit its frame. In this example, the AP 110 may set the AIFSN, CWmin and CWmax of the AT by transmitting a message to the AT indicating values for the AIFSN, CWmin and CWmax. Upon receiving the message, the AT may set the AIFSN, CWmin and CWmax according to the indicated values.

In another example, an AT (e.g., AT 120a) may determine whether a resource (e.g., frequency band) is free (idle) or busy based on an energy detection ("ED") threshold. In this example, the AT may detect the energy of the resource (e.g., frequency band) and compare the detected energy with the ED threshold. If the detected energy is below the ED threshold, then the AT may determine that the resource (e.g., frequency band) is free (idle), and, if the detected energy is equal to or above the ED threshold, then the AT may determine that the resource (e.g., frequency band) is busy.

In this example, the AP 110 may select a higher ED threshold for a low battery life AT (e.g., AT 120a) compared with a non-low battery life AT (e.g., 120b) to reduce the access delay of the low battery life AT. The higher ED threshold increases the likelihood that the AT will find the resource (e.g., frequency band) free (e.g., when the AT monitors the resource within a contention window). In this example, the AP 110 may set the ED threshold of the AT by transmitting a message to the AT indicating a value for the ED threshold. Upon receiving the message, the AT may set the ED threshold according to the indicated value.

In another example, an AT (e.g., AT 120a) may transmit data within a transmission opportunity ("TXOP"). The TXOP is a duration during which the AT can transmit data when the AT gains access to a resource (e.g., frequency band). In this example, the AP 110 may select a longer TXOP for a low battery life AT compared with a non-low battery life AT. The longer TXOP allows the low battery life AT to transmit more data after gaining access to the resource (e.g., frequency band). This may reduce the number of times the AT needs to contend for the resource (e.g., frequency band) to transmit all of its data, thereby reducing energy consumption. In this example, the AP 110 may set the TXOP by transmitting a message to the AT indicating a value for the TXOP. Upon receiving the message, the AT may set the TXOP according to the indicated value.

In another example, an AT (e.g., AT 120a) may gain access to a resource (e.g., frequency band) to transmit data according to a certain random access probability. The higher the random access probability, the greater the likelihood of the AT gaining access to the resource to transmit data. In this example, the AP may transmit a trigger frame to indicate one or more different resources (e.g., frequency bands) for random access. In response, the AT may randomly select one or more of the resources based on the random access probability. In this example, the AP 110 may select a higher random access probability for a low battery life AT (e.g., AT 120a) compared with a non-low battery life AT (e.g., AT 120b). The AP 110 may set the random access probability of an AT by transmitting a message to the AT indicating a value for the random access probability. Upon receiving the message, the AT may set the radon access probability according to the indicated value.

Figure 7:
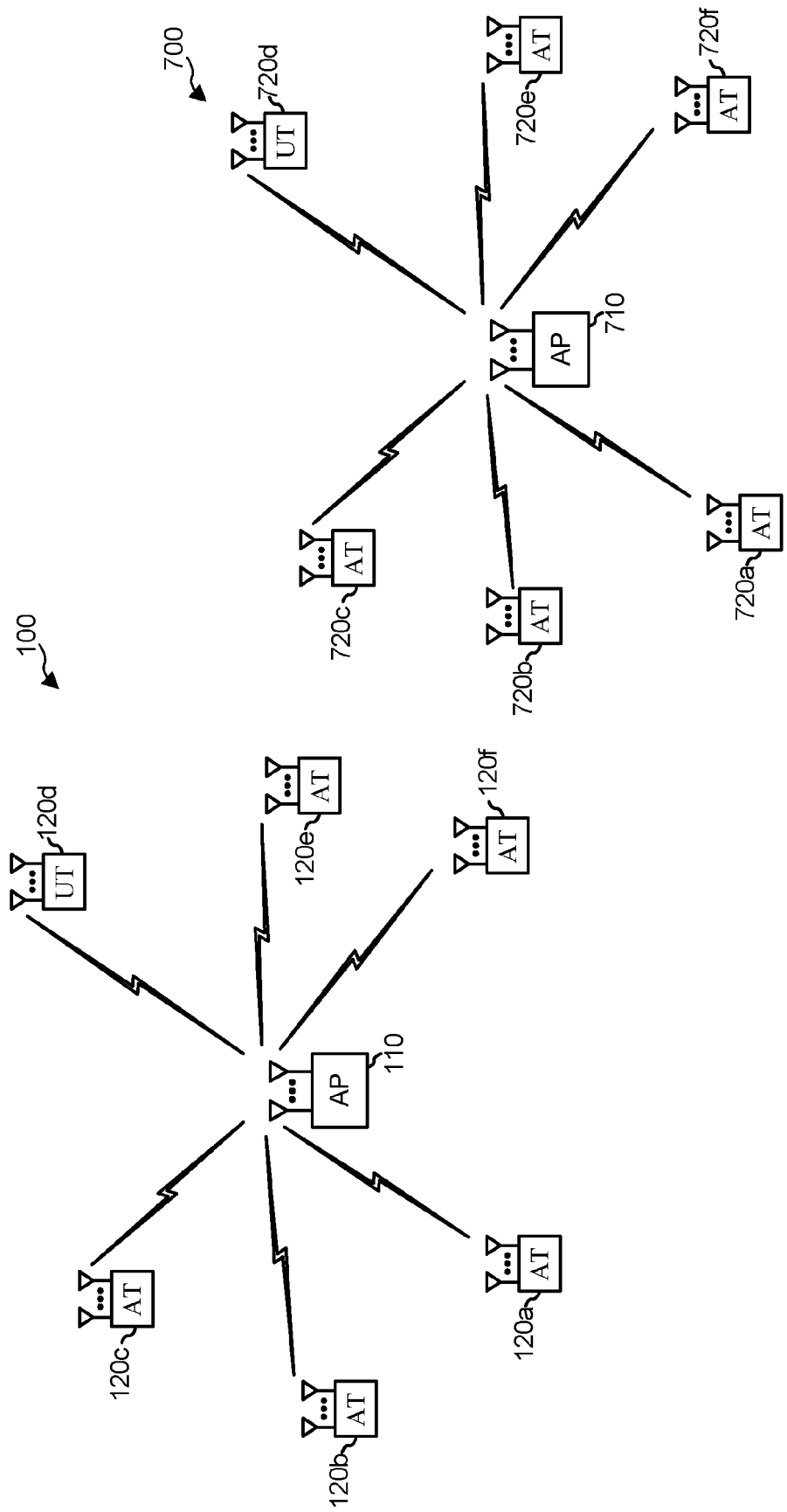
FIG. 7 illustrates an exemplary neighboring wireless communication system in accordance with certain aspects of the present disclosure.

In certain aspects, the AP 110 may provide more interference protection for ATs with low battery life to reduce their transmission times for the same amount of traffic, and hence reduce their power consumption. For example, the wireless communication system 100 may have overlapping resources with a neighboring wireless communication system 700, an example of which is shown in FIG. 7. In this example, the neighboring wireless communication system 700 may include an AP 710 and multiple ATs 720a-720f The neighboring wireless communication system 700 may be located close enough to the wireless communication system 100 to cause interference on one or more of the overlapping resources. In this example, each of the wireless communication systems may be referred to as a basic service set ("BSS"), and the neighboring communication system may be referred to as an overlapping base service set ("OBSS").

The overlapping resources are resources that are reused by the neighboring communication system 700, and may be referred to as non-dedicated resources. In this example, the wireless communication system 100 may also have resources (e.g., frequency bands) that are not being reused by the neighboring communication system 700. These resources may be referred to as dedicated resources. The dedicated resources may include orthogonal frequency bands and/or time slots reserved for the wireless communication system 100 vis-à-vis the neighboring wireless communication system 700. The dedicated resources may experience little to no interference from the neighboring wireless communication system 700 compared with the non-dedicated resources.

In this example, the AP 110 prioritizes the assignment of dedicated resources to low battery life ATs over non-low battery life ATs. In other words, the AP 110 may assign dedicated resources to low battery life ATs for DL/UL transmissions before assigning them to non-low battery life ATs. Assigning dedicated resources to low battery life ATs may help reduce interference impact and improve transmission rate for the low battery life ATs, and reduce transmission time and energy consumption for the low battery life ATs. The AP 110 may assign a dedicated resource (e.g., frequency band) to a low battery life AT (e.g., AT 120*a*) by transmitting a message to the AT indicating the dedicated resource. Upon receiving the message, the AT may use the indicated resource for UL transmission and/or receiving DL data from the AP 110. The AP 110 may also the use dedicated resource to transmit DL data to the low battery life AT.

In certain aspects, an AT may transmit UL data to the AP 110 using frames. In this example, the header of each frame may include an identification (ID) identifying the respective BSS. For example, an AT (e.g., AT 1200 in wireless communication system 100 may transmit a frame with an ID identifying the BSS corresponding to the wireless communication system 100. The AP 710 or an AT (e.g., AT 720*b*) in the neighboring wireless communication system 700 may intercept and decode the ID in the frame to identify the BSS associated with the frame. After identifying the frame as coming from a different BSS, the AP 710 or AT in the neighboring wireless communication system may decide to reuse the same resource (e.g., transmit and/or receive on the same resource) as the frame since the frame is from a different BSS.

In one example, the AP 110 may instruct a low battery life AT (e.g., AT 1200 to set an indicator in a header of each frame to indicate no OBSS reuse. In response, the low battery life AT may include an indicator in each frame transmitted to the AP 110 indicating no OBSS reuse. The no OBSS reuse indicator prohibits an OBSS from reusing the same resource as the frame. Thus, when the AP 710 or an AT (e.g., AT 720*b*) in the neighboring wireless communication system 700 intercepts and decodes the no OBSS reuse indicator in the frame, the AP 710 or AT may refrain from using the same resource as the frame even if the ID in the frame identifies a different BSS (i.e., BSS associated with the wireless communication system 100). Thus, the no OBSS reuse indicator prevents the AP 710 or AT in the neighboring wireless communication system 700 from reusing the same resource used for the frame. As a result, the frame from the low battery life AT may suffer little to no interference from the neighboring wireless communication system 700.

In one example, each frame from the low battery life AT may include an indication of the duration of the frame, which may be intercepted and decoded by the AP 710 or an AT (e.g., AT 720*b*) in the neighboring wireless communication system 700. In this example, when the AP 710 or AT refrain from using the same resource as a frame in response to an indicator in the frame indicating no OBSS reuse, the AP 710 or AT may refrain from reusing the resource for the indicated duration of the frame.

In certain aspects, the AP 110 may assign a frequency band for a low battery life AT having lower path loss than a frequency band assigned to a non-low battery life AT. For example, the AP 110 may assign a first frequency band having a bandwidth of approximately 2.4 GHz to a low battery life AT (e.g., AT 120*a*) and assign a second frequency band having a bandwidth of approximately 5 GHz to a non-low battery life AT (e.g., AT 120*b*), in which the first frequency band has lower path loss than the second frequency band. The low path loss reduces the transmit time for the low battery life AT for the same amount of traffic, and hence reduces energy consumption for the low battery life AT.

In certain aspects, the AP 110 may schedule sleep and wakeup times for a low battery life AT (e.g., AT 120*a*) to reduce energy consumption of the low battery life AT. For example, the AP 110 may provide the low battery life AT with a sleep and wakeup schedule, in which the low battery life AT sleeps most of the time and periodically wakes up during wakeup windows to receive DL data from the AP 110 and/or transmit UL data to the AP 110. In this example, the AP may exclude other ATs (e.g., ATs 120*b*-120*i*) from receiving and or transmitting during the wakeup windows of the low battery life AT to reduce interference and/or resource contention during the wakeup windows of the low battery life AT.

The AP 110 may communicate the sleep and wakeup schedule to the low battery life by transmitting a message to the low battery life AT indicating the sleep and wakeup schedule. Upon receiving the message, the low battery life AT may sleep outside the wakeup windows indicated in the received schedule. The transceiver (e.g., RF chain) of the low battery life AT may be powered down when the AT is in sleep mode to conserve power. During each wakeup window, the low battery life AT may transmit UL data to the AP 110 and/or receive DL data from the AP 110. The transceiver (e.g., RF chain) of the low battery life AT may be powered on when the AT is in awake mode. As discussed above, the AP 110 may exclude other ATs in the wireless communication system 100 from transmitting and/or receiving during the wakeup windows of the low battery life AT.

Figure 8:
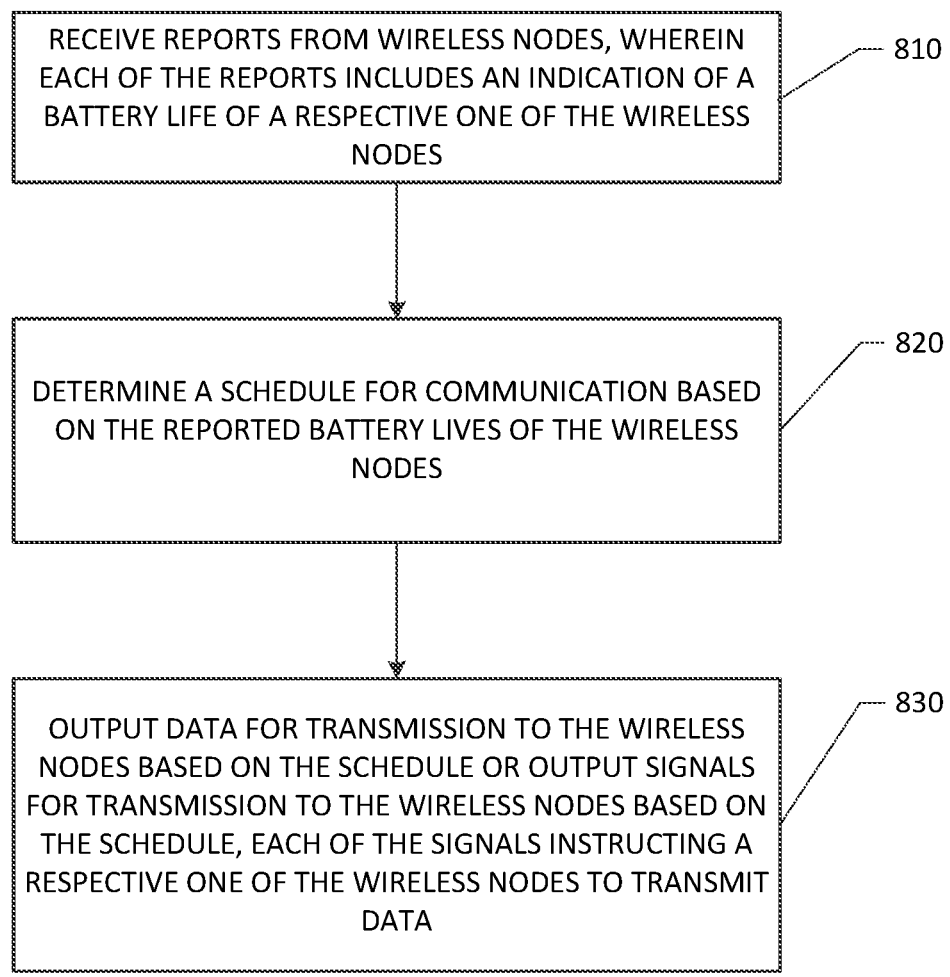
FIG. 8 is a flowchart of a method for wireless communication in accordance with certain aspects of the present disclosure.

FIG. 8 is a flowchart illustrating a method 800 for wireless communication according to certain aspects of the present disclosure. The method 800 may be performed by a wireless node (e.g., AP 110).

In step 810, reports are received from wireless nodes, wherein each of the reports includes an indication of a battery life of a respective one of the wireless nodes. For example, a report may be received in a message, a control field (e.g., HT or HE control field) of a MAC frame, and/or header of a physical frame. The indication of the battery life of a wireless node (e.g., AT 120) may be in the form of a percentage of remaining battery life, an absolute time of remaining battery life (e.g., X hours left), and an absolute remaining battery charge (e.g., mA*hour). In another example, the indication of the battery life of a wireless node (e.g., AT 120) may indicate whether the battery life of the wireless node is considered low for scheduling purposes (e.g., whether the battery life of the wireless node is equal to or below a battery life threshold).

In step 820, a schedule is determined for communication based on the reported battery lives of the wireless nodes. The communication may include transmissions (e.g., DL transmissions) to the wireless nodes and/or transmissions (e.g., UL transmissions) from the wireless nodes. In one example, transmissions for one or more low battery life wireless nodes may be prioritized over transmissions for one or more non-low battery life wireless nodes. In this example, low battery life wireless nodes (e.g., access terminals) may be wireless nodes having battery lives equal to or below a battery life threshold. In step 830, data is outputted for transmission to the wireless nodes based on the schedule or signals are outputted for transmission to the wireless nodes based on the schedule, each of the signals instructing a respective one of the wireless nodes to transmit data. For example, DL data may be outputted to the wireless nodes (e.g., access terminals) based on the schedule. In another example, transmit ready signals may be outputted to the wireless nodes (access terminals) based on the schedule.

Figure 9:
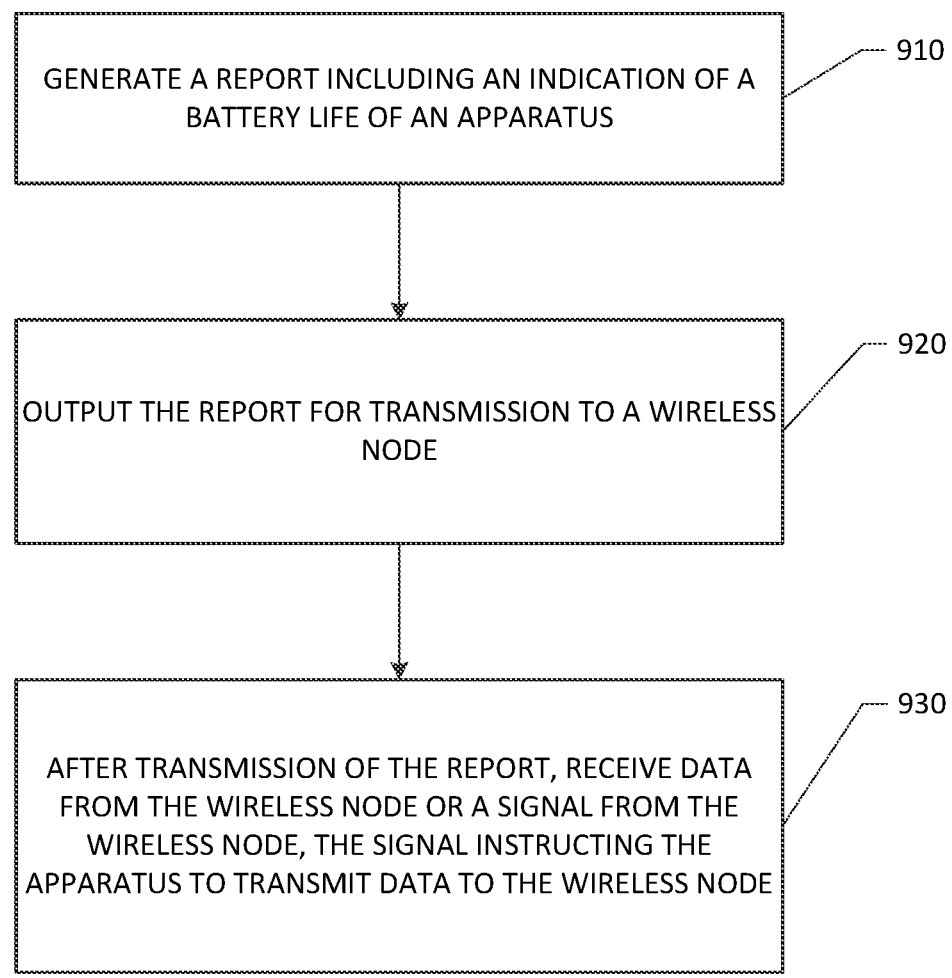
FIG. 9 is a flowchart of another method for wireless communication in accordance with certain aspects of the present disclosure.

FIG. 9 is a flowchart illustrating a method 900 for wireless communication according to certain aspects of the present disclosure. The method 900 may be performed by a wireless node (e.g., AT 120).

In step 910, a report including an indication of a battery life of an apparatus is generated. In step 920, the report is outputted for transmission to a wireless node. In step 930, after transmission of the report, data is received from the wireless node or a signal is received from the wireless node, the signal instructing the apparatus to transmit data to the wireless node.

Figure 10:
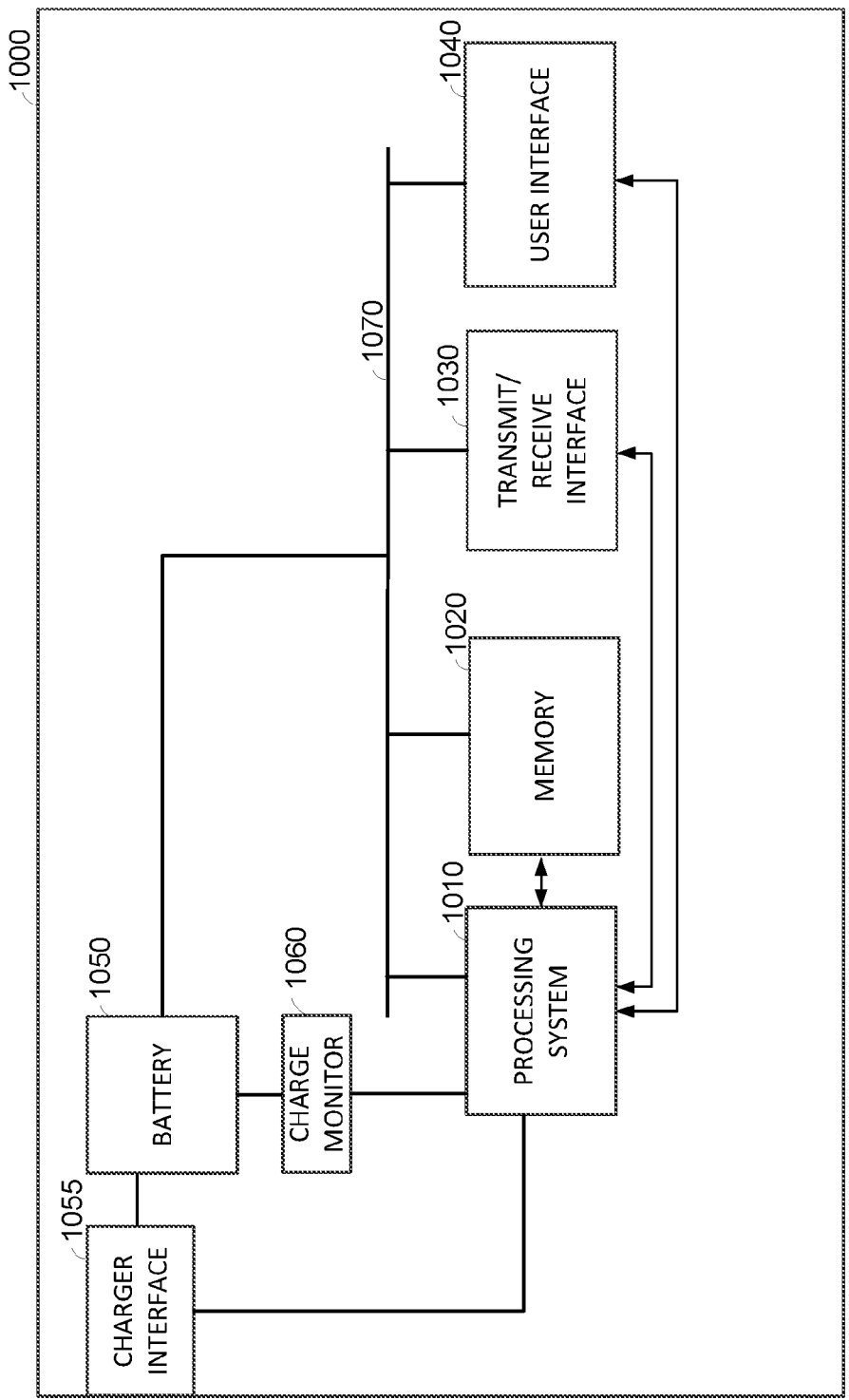
FIG. 10 illustrates an exemplary device in accordance with certain aspects of the present disclosure.

FIG. 10 illustrates an example device 1000 according to certain aspects of the present disclosure. The device 1000 may be configured to operate in a wireless node (e.g., access point 110 or access terminal 120) and to perform one or more of the operations described herein. The device 1000 includes a processing system 1010, and a memory 1020 coupled to the processor system 1010. The memory 1020 may store instructions that, when executed by the processing system 1010, cause the processing system 1010 to perform one or more of the operations described herein. Exemplary implementations of the processing system 1010 are provided below. The device 1000 also comprises a transmit/receive interface 1030 coupled to the processing system 1010. The interface 1030 (e.g., interface bus) may be configured to interface the processing system 1010 to a radio frequency (RF) front end (e.g., transceivers 226-1 to 226-N or 226-1 to 266-N).

In certain aspects, the processing system 1010 may include one or more of the following: a transmit data processor (e.g., transmit data processor 220 or 260), a frame builder (e.g., frame builder 222 or 262), a transmit processor (e.g., transmit processor 224 or 264) and/or a controller (e.g., controller 234 or 274) for performing one or more of the operations described herein.

In the case of an access terminal 120, the device 1000 may include a user interface 1040 coupled to the processing system 1010. The user interface 1040 may be configured to receive data from a user (e.g., via keypad, mouse, joystick, etc.) and provide the data to the processing system 1010. The user interface 1040 may also be configured to output data from the processing system 1010 to the user (e.g., via a display, speaker, etc.). In this case, the data may undergo additional processing before being output to the user. In the case of an access point 110, the user interface 1040 may be omitted.

In the case of an access terminal 120, the device 1000 may also include a battery 1050, a charger interface 1055, a charge monitor 1060, and a power distribution network 1070. The battery 1050 provides power to the processing system 1010, the memory 1020, the transmit/receive interface 1030, and the user interface 1040 via the power distribution network 1070.

The charger interface 1055 is configured to couple an external charger (e.g., a wall charger, portable charger, etc.) to charge the battery 1050. In certain aspects, the charger interface 1055 may detect when the charger interface 1055 is coupled to a charger, and communicate this information to the processing system 1010 so that the processing system 1010 can determine when the battery 1050 is being charged.

In certain aspects, the charger interface 1055 may also be configured to receive data from the charger and forward the data to the processing system 1010. For example, the data may indicate the type of the charger (e.g., wall charger, portable charger, etc.). This allows the processing system 1010 to determine the type of the charger.

The charge monitor 1060 may monitor the amount of charge of the battery 1050, the voltage of the battery 1050 and/or the amount of current being supplied by the battery 1050 to the power distribution network 1070. The charge monitor 1060 may communicate this information to the processing system 1010 so that the processing system 1010 can determine the battery life of the battery 1050.

In the case of an access point 110, the battery 1050, the charger interface 1055 and the charge monitor 1060 may be omitted (e.g., for an access point 110 that is powered by an external power source).

Examples of means for receiving reports from wireless nodes include the transceivers 226-N or 266-N, the receive processor 242 or 282, and the transmit/receive interface 1030. Examples of means for determining a schedule based on the indications of the battery lives of the wireless nodes include the controller 234 or 274, the processing system 1010. Examples of means for outputting data for transmission to the wireless nodes based on the schedule or outputting signals for transmission to the wireless nodes based on the schedule include the transceivers 226-N or 266-N, the transmit processors 224 or 264, and the transmit/receive interface 1030. Examples of means for determining whether a first one of the wireless nodes has a lower battery life than a second one of the wireless nodes include the controller 234 or 274, and the processing system 1010. Examples of means for outputting a beacon for transmission to the wireless nodes include the transceivers 226-N or 266-N, the transmit processors 224 or 264, and the transmit/receive interface 1030. Examples of means for receiving, after the beacon transmission, messages from the wireless nodes include the transceivers 226-N or 266-N, the receive processor 242 or 282, and the transmit/receive interface 1030. Examples of means for receiving scheduling requests from the wireless nodes include the transceivers 226-N or 266-N, the receive processor 242 or 282, and the transmit/receive interface 1030. Examples of means for determining whether a first one of the wireless nodes has a battery life equal to or below a battery threshold include the controller 234 or 274, and the processing system 1010. Examples of means for assigning a first resource to a transmission for the first one of the wireless nodes and means for assigning a second resource to the transmission for the first one of the wireless nodes include the controller 234 or 274, and the processing system 1010. Examples of means for assigning a first frequency band to a transmission for the first one of the wireless nodes and means for assigning a second frequency band to the transmission for the first one of the wireless nodes include the controller 234 or 274, and the processing system 1010. Examples of means for reducing an access delay for the first one of the wireless nodes if a determination is made that the first one of the wireless nodes has a battery life equal to or below the battery threshold include the controller 234 or 274, and the processing system 1010.

Examples of means for generating a report including an indication of a battery life of the apparatus include the frame builder 222 or 262, the controller 234 or 274, and the processing system 1010. Examples of means for outputting the report for transmission to a wireless node include the transceivers 226-N or 266-N, the transmit processors 224 or 264, and the transmit/receive interface 1030. Examples of means for, after transmission of the report, receiving data from the wireless node or a signal from the wireless node include the transceivers 226-N or 266-N, the receive processor 242 or 282, and the transmit/receive interface 1030. Examples of means for determining a battery charging status of the apparatus include the charger interface 1055, the processing system 101, and the controller 234 or 274. Examples of means for receiving a beacon from the wireless node include the transceivers 226-N or 266-N, the receive processor 242 or 282, and the transmit/receive interface 1030. Examples of means for generating a message after reception of the beacon the frame builder 222 or 262, the controller 234 or 274, and the processing system 1010. Examples of means for outputting the message for transmission to the wireless node include the transceivers 226-N or 266-N, the transmit processors 224 or 264, and the transmit/receive interface 1030. Examples of means for generating a message including a request to transmit the data to the wireless node and the report include the frame builder 222 or 262, the controller 234 or 274, and the processing system 1010. Examples of means for outputting the message for transmission to the wireless node include the transceivers 226-N or 266-N, the transmit processors 224 or 264, and the transmit/receive interface 1030. Examples of means for determining whether the battery life is equal to or below a battery threshold include the controller 234 or 274, and the processing system 1010.

The various operations of methods described above may be performed by any suitable means capable of performing the corresponding functions. The means may include various hardware and/or software component(s) and/or module (s), including, but not limited to a circuit, an application specific integrated circuit (ASIC), or processor. Generally, where there are operations illustrated in figures, those operations may have corresponding counterpart means-plus-function components with similar numbering.

In some cases, rather than actually transmitting a frame a device may have an interface to output a frame for transmission (a means for outputting). For example, a processor may output a frame, via a bus interface, to a radio frequency (RF) front end for transmission. Similarly, rather than actually receiving a frame, a device may have an interface to obtain a frame received from another device (a means for obtaining). For example, a processor may obtain (or receive) a frame, via a bus interface, from an RF front end for reception.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of an access terminal 220 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processor may be responsible for managing the bus and general processing, including the execution of software stored on the machine-readable media. The processor may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product. The computer-program product may comprise packaging materials.

In a hardware implementation, the machine-readable media may be part of the processing system separate from the processor. However, as those skilled in the art will readily appreciate, the machine-readable media, or any portion thereof, may be external to the processing system. By way of example, the machine-readable media may include a transmission line, a carrier wave modulated by data, and/or a computer product separate from the wireless node, all which may be accessed by the processor through the bus interface. Alternatively, or in addition, the machine-readable media, or any portion thereof, may be integrated into the processor, such as the case may be with cache and/or general register files.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The machine-readable media may comprise a number of software modules. The software modules include instructions that, when executed by the processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For certain aspects, the computer program product may include packaging material.

Further, it should be appreciated that modules and/or other appropriate means for performing the methods and techniques described herein can be downloaded and/or otherwise obtained by an access terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that an access terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An apparatus for wireless communication, comprising:
   an interface configured to receive reports from wireless nodes, wherein each of the reports includes an indication of a battery life of a respective one of the wireless nodes and a battery charging status indicating whether the respective one of the wireless nodes is in a process of being charged by a battery charger; and
   a processing system configured to determine a schedule for communication based on the indications of the battery lives of the wireless nodes and the battery charging statuses of the wireless nodes;

wherein the interface is further configured to output data for transmission to the wireless nodes based on the schedule or to output signals for transmission to the wireless nodes based on the schedule, each of the signals instructing a respective one of the wireless nodes to transmit data to the apparatus.

2. The apparatus of claim 1, wherein the indication of the battery life of each of the wireless nodes includes an indication of at least one of a remaining battery charge, a time of remaining battery life, or a percentage of remaining battery life.

3. The apparatus of claim 1, wherein the processing system is configured to:
   determine whether a first one of the wireless nodes has a lower battery life than a second one of the wireless nodes based on the indication of the battery life of the first one of the wireless nodes and the indication of the battery life of the second one of the wireless nodes; and
   schedule a transmission for the first one of the wireless nodes no later than a transmission for the second one of the wireless nodes if a determination is made that the first one of the wireless nodes has a lower battery life than the second one of the wireless nodes.

4. The apparatus of claim 1, wherein the processing system is configured to:
   receive scheduling requests from the wireless nodes via the interface;
   wherein the processing system determines the schedule after receiving the scheduling requests.

5. The apparatus of claim 4, wherein the interface is configured to receive the report for at least one of the wireless nodes in at least one of the scheduling requests.

6. The apparatus of claim 1, wherein the battery charging status indicates a type of the battery charger, the type of the battery charger including at least one of a portable charger, a wall charger, or a car charger.

7. The apparatus of claim 1, further comprising at least one antenna via which the data or the output signals are transmitted, wherein the apparatus is configured as a wireless node.

8. An apparatus for wireless communication, comprising:
   an interface configured to receive reports from wireless nodes, wherein each of the reports includes an indication of a battery life of a respective one of the wireless nodes; and
   a processing system configured to:
      output to the interface a beacon for transmission to the wireless nodes, wherein the beacon indicates that data is awaiting transmission to each of the wireless nodes;
      receive, after the beacon transmission, messages from the wireless nodes via the interface, wherein each of the messages indicates that a respective one of the wireless nodes is ready to receive the data awaiting transmission to the wireless node; and
      determine, after receiving the messages, a schedule for communication based on the indications of the battery lives of the wireless nodes;
   wherein the interface is further configured to output the data for transmission to the wireless nodes based on the schedule.

9. The apparatus of claim 8, wherein the messages comprise power save poll (PS-Poll) frames.

10. The apparatus of claim 8, wherein the interface is configured to receive the report for at least one of the wireless nodes in at least one of the messages.

11. The apparatus of claim 8, further comprising at least one antenna via which the data is transmitted, wherein the apparatus is configured as a wireless node.

12. An apparatus for wireless communication, comprising:
   an interface configured to receive reports from wireless nodes, wherein each of the reports includes an indication of a battery life of a respective one of the wireless nodes; and
   a processing system configured to:
      determine a schedule for communication based on the indications of the battery lives of the wireless nodes;
      determine whether a first one of the wireless nodes has a battery life equal to or below a battery threshold based on the indication of the battery life of the first one of the wireless nodes;
      assign a first resource to a transmission for the first one of the wireless nodes if a determination is made that the first one of the wireless nodes has a battery life equal to or below the battery threshold, wherein the first resource is not being reused by a neighboring wireless communication system; and
      assign a second resource to the transmission for the first one of the wireless nodes if a determination is made that the first one of the wireless nodes does not have a battery life equal to or below the battery threshold, wherein the second resource is being reused by the neighboring wireless communication system;
   wherein the interface is further configured to output data for transmission to the wireless nodes based on the schedule or to output signals for transmission to the wireless nodes based on the schedule, each of the signals instructing a respective one of the wireless nodes to transmit data to the apparatus.

13. The apparatus of claim 12, further comprising at least one antenna via which the data or the output signals are transmitted, wherein the apparatus is configured as a wireless node.

14. An apparatus for wireless communication, comprising:
   an interface configured to receive reports from wireless nodes, wherein each of the reports includes an indication of a battery life of a respective one of the wireless nodes; and
   a processing system configured to:
      determine a schedule for communication based on the indications of the battery lives of the wireless nodes;
      determine whether a first one of the wireless nodes has a battery life equal to or below a battery threshold based on the indication of the battery life of the first one of the wireless nodes;
      assign a first frequency band to a transmission for the first one of the wireless nodes if a determination is made that the first one of the wireless nodes has a battery life equal to or below the battery threshold, wherein the first frequency band has lower path loss than a second frequency band; and
      assign the second frequency band to the transmission for the first one of the wireless nodes if a determination is made that the first one of the wireless nodes does not have a battery life equal to or below the battery threshold;
   wherein the interface is further configured to output data for transmission to the wireless nodes based on the schedule or to output signals for transmission to the wireless nodes based on the schedule, each of the signals instructing a respective one of the wireless nodes to transmit data to the apparatus.

15. The apparatus of claim 14, further comprising at least one antenna via which the data or the output signals are transmitted, wherein the apparatus is configured as a wireless node.

16. An apparatus for wireless communication, comprising:
an interface configured to receive reports from wireless nodes, wherein each of the reports includes an indication of a battery life of a respective one of the wireless nodes; and
a processing system configured to:
determine a schedule for communication based on the indications of the battery lives of the wireless nodes;
determine whether a first one of the wireless nodes has a battery life equal to or below a battery threshold based on the indication of the battery life of the first one of the wireless nodes; and
reduce an access delay for the first one of the wireless nodes if a determination is made that the first one of the wireless nodes has a battery life equal to or below the battery threshold, wherein the access delay is an amount of time to access one or more resources for a transmission for the first one of the wireless nodes;
wherein the interface is further configured to output data for transmission to the wireless nodes based on the schedule or to output signals for transmission to the wireless nodes based on the schedule, each of the signals instructing a respective one of the wireless nodes to transmit data to the apparatus.

17. The apparatus of claim 16, wherein the processing system is configured to reduce the access delay for the first one of the wireless nodes by selecting at least one of a shorter minimum contention window (CWmin), a shorter maximum contention window (CWmax), a shorter arbitration inter-frame space number (AIFSN), or a longer transmission opportunity (TXOP) for the first one of the wireless nodes.

18. The apparatus of claim 16, wherein the processing system is configured to reduce the access delay for the first one of the wireless nodes by selecting at least one of a higher energy detection threshold or a higher channel clearance assessment threshold for the first one of the wireless nodes.

19. The apparatus of claim 16, wherein the processing system is configured to reduce the access delay for the first one of the wireless nodes by selecting a higher random access probability for the first one of the wireless nodes.

20. The apparatus of claim 16, further comprising at least one antenna via which the data or the output signals are transmitted, wherein the apparatus is configured as a wireless node.

21. An apparatus for wireless communication, comprising:
a processing system configured to generate a report including an indication of a battery life of the apparatus and a battery charging status indicating whether the apparatus is in a process of being charged by a battery charger; and
an interface configured to:
output the report for transmission to a wireless node; and
after transmission of the report, receive data from the wireless node or a signal from the wireless node, the signal instructing the apparatus to transmit data to the wireless node.

22. The apparatus of claim 21, wherein the indication of the battery life includes an indication of at least one of a remaining battery charge, a time of remaining battery life, or a percentage of remaining battery life.

23. The apparatus of claim 21, wherein:
the processing system is configured to generate a message including a request to transmit the data to the wireless node and the report; and
the interface is configured to output the message for transmission to the wireless node, wherein the interface receives the signal instructing the apparatus to transmit the data after transmission of the message.

24. The apparatus of claim 21, wherein the processing system is configured to:
determine whether the battery life is equal to or below a battery threshold; and
generate the report if a determination is made that the battery life is equal to below the battery threshold.

25. The apparatus of claim 21, wherein the battery charging status indicates a type of the battery charger, the type of the battery charger including at least one of a portable charger, a wall charger, or a car charger.

26. The apparatus of claim 21, further comprising at least one antenna via which the report is transmitted, wherein the apparatus is configured as a wireless node.

27. An apparatus for wireless communication, comprising:
an interface configured to receive a beacon from a wireless node, wherein the beacon indicates that the data is awaiting transmission to the apparatus; and
a processing system configured to:
generate a message after reception of the beacon, the message indicating that the apparatus is ready to receive the data; and
generate a report including an indication of a battery life of the apparatus;
wherein the interface is further configured to:
output the message and the report for transmission to the wireless node; and
after transmission of the report, receive the data from the wireless node.

28. The apparatus of claim 27, wherein the message includes the report.

29. The apparatus of claim 27, further comprising at least one antenna via which the report is transmitted, wherein the apparatus is configured as a wireless node.

* * * * *